(12) United States Patent
Gundiah et al.

(10) Patent No.: US 8,486,300 B2
(45) Date of Patent: Jul. 16, 2013

(54) LANTHANIDE DOPED STRONTIUM BARIUM MIXED HALIDE SCINTILLATORS

(75) Inventors: Gautam Gundiah, Berkeley, CA (US); Gregory Bizarri, San Francisco, CA (US); Stephen M. Hanrahan, Berkeley, CA (US); Edith Bourret-Courchesne, Berkeley, CA (US); Stephen E. Derenzo, Pinole, CA (US)

(73) Assignee: The Regents of the University of California, Oakland, CA (US)

( * ) Notice: Subject to any disclaimer, the term of this patent is extended or adjusted under 35 U.S.C. 154(b) by 278 days.

(21) Appl. No.: 12/986,103

(22) Filed: Jan. 6, 2011

(65) Prior Publication Data

US 2011/0165422 A1    Jul. 7, 2011

Related U.S. Application Data

(60) Provisional application No. 61/292,796, filed on Jan. 6, 2010.

(51) Int. Cl.
*C09K 11/61*    (2006.01)
*C09K 11/55*    (2006.01)

(52) U.S. Cl.
USPC ............... 252/301.4 H; 117/940; 250/483.1; 250/361 R (58) Field of Classification Search
USPC ............... 252/301.4 H; 117/940; 250/483.1, 250/361 R
See application file for complete search history.

(56) References Cited

PUBLICATIONS

Gundiah et al, "Scintillation properties of Eu2+-activated barium fluoroiodide", 2009 IEEE Nuclear Science Symposium Confrenece Record, Olrando Fl, Oct. 24, 2009-Nov. 1, 2009, N25-143, pp. 1575-1578.*
Radzhabov et al, "Photoionization process in fluorohalide crystals doped with Eu2+", J. Phys.:Condens. Matter 13, 2001, pp. 1159-1169.*
Nicollin et al, "Experimental contribution to the study of S-state ions in ionic single crystals", J. Phys. C.:Solid State Phys., vol. 11, 1978, pp. 4803-4814.*

* cited by examiner

*Primary Examiner* — Carol M Koslow
(74) *Attorney, Agent, or Firm* — Robin C. Chiang; Lawrence Berkeley National Laboratory (57) ABSTRACT

The present invention provides for a composition comprising an inorganic scintillator comprising a lanthanide-doped strontium barium mixed halide useful for detecting nuclear material.

27 Claims, 6 Drawing Sheets

LANTHANIDE DOPED STRONTIUM BARIUM MIXED HALIDE SCINTILLATORS

RELATED PATENT APPLICATIONS

The application claims priority to U.S. Provisional Patent Application Ser. No. 61/292,796, filed Jan. 6, 2010, which is herein incorporated by reference in its entirety.

STATEMENT OF GOVERNMENTAL SUPPORT

The invention was made with government support under Grant No. HSHQDC-07-X-00170 awarded by the U.S. Department of Homeland Security, and Contract No. DE-AC02-05CH11231 awarded by the U.S. Department of Energy. The government has certain rights in the invention.

FIELD OF THE INVENTION

The present invention is in the field of inorganic crystals with scintillation properties useful as gamma-ray detectors.

BACKGROUND OF THE INVENTION

The need for radiation detecting materials has been at the forefront of materials research in recent years due to applications in national security, medical imaging, X-ray detection, oil well logging, and high-energy physics. Essential qualities that a scintillator must possess are high light yields, fast luminescence decay (below 1000 ns), good stopping power, high density, good energy resolution, ease of growth, proportionality, and stability under ambient conditions. $La_xBr_3$:$Ce_{1-x}$ (E. V. D. van Loef et al, Appl. Phys. Lett., 2001, 79, 1573) and $Sr_xI_2$:$Eu_{1-x}$ (N. Cherepy et al, Appl. Phys. Lett. 2007, 92, 083508) are present day benchmark materials that satisfy some of the desired criteria, but their application is limited due to the extreme hygroscopic nature.

Barium mixed halides, such as barium fluoride iodide (BaFI) doped with Eu, have been studied as a photostimulable phosphor since the mid 1980's for applications in computed radiology (K. Takahashi et al, J. Electrochem. Soc, 1985, 132, 1492). However, none of these have been identified as candidate scintillators for detecting gamma rays.

SUMMARY OF THE INVENTION

The present invention provides for a composition comprising an inorganic scintillator comprising a lanthanide-doped strontium barium mixed halide useful for detecting nuclear material. The lanthanide-doped strontium barium mixed halide of the present invention comprises a chemical formula as described by formula (I), (II), or (III).

The present invention provides for an inorganic scintillator having the formula:

$$Sr_{1-y'-y}Ba_yX^1{}_xX^2{}_{2-x}:Ln_{y'} \qquad (I);$$

wherein $X^1$ is a first halogen element, $X^2$ is a second halogen element, $X^1$ and $X^2$ are not the same halogen element, Ln is a lanthanide with a valence of 2+, x has a value having the range $0<x\leq2$, y' has a value having the range $0\leq y'<1$, y has a value having the range $0<y\leq1$, and $y'+y<1$; and the inorganic scintillator is a single crystal having at least one dimension of a length of at least 1 mm, at least 5 mm, at least 1 cm, or at least 3 cm, or a length at least sufficient to stop or absorb gamma-radiation.

The present invention provides for an inorganic scintillator having the formula:

$$Sr_{1-y'-2y}Ba_yX^1{}_xX^2{}_{2-x}:Ln_{y'},M_y \qquad (II);$$

wherein $X^1$ is a first halogen element, $X^2$ is a second halogen element, $X^1$ and $X^2$ are not the same halogen element, Ln is a lanthanide with a valence of 3+, M is an alkaline metal with an atomic number smaller than the atomic number of Sr and/or Ba, x has a value having the range $0<x<2$, and y' has a value having the range $0\leq y'<1$, y has a value having the range $0<y\leq0.5$, and $y'+2y<1$; or, $$Sr_{1-y'-z}Ba_yX^1{}_xX^2{}_{2-x}:Ln_z \qquad (III);$$

wherein $X^1$ is a first halogen element, $X^2$ is a second halogen element, $X^1$ and $X^2$ are not the same halogen element, Ln is a lanthanide with a valence of 3+, x has a value having the range $0<x<2$, y' has a value having the range $0\leq y'<1$, and z has a value having the range $0<z\leq0.1$, and $y'+z<1$; and wherein the inorganic scintillator is a single crystal having at least one dimension of a length of at least 1 mm, at least 5 mm, at least 1 cm, or at least 3 cm, or a length at least sufficient to stop or absorb gamma-radiation.

The present invention provides for an inorganic scintillator described and/or having a set of properties described in Example 1.

The present invention also provides for a composition comprising essentially of a mixture of halide salts useful for producing the inorganic scintillator. The mixture comprises essentially of solid strontium halide(s), optionally barium halide(s), lanthanide halide(s), and/or optionally alkaline metal halide(s); wherein the mixture provides a stoichiometry of the elements corresponding to formula (I), (II), or (III) as described herein.

The halide salts can be powdered crystals. The halide salts are essentially pure. Such halide salts are commercially available.

The present invention further provides for a method for producing the composition comprising an inorganic scintillator as described herein comprising: (a) providing a composition comprising essentially of a mixture of halide salts useful for producing the inorganic scintillator as described herein, (b) heating the mixture so that the halide salts start to react, and (c) cooling the mixture to room temperature such that the composition comprising an inorganic scintillator is formed.

The invention provides for a device comprising a composition comprising an inorganic scintillator or lanthanide-doped strontium barium mixed halide of the present invention and a photodetector. The device is useful for the detection of an ionizing radiation, such as gamma radiation. The device is useful for industrial, medical, protective and defensive purpose or in the oil and nuclear industry.

In some embodiments of the invention, the device is a gamma ray (or like radiation) detector which comprises a single crystal of lanthanide-doped strontium barium mixed halide. When assembled in a complete detector, the scintillator crystal is optically coupled, either directly or through a suitable light path, to the photosensitive surface of a photodetector for generation of an electrical signal in response to the emission of a light pulse by the scintillator. The inorganic scintillator of the invention possesses certain important characteristics, most notably high light output, very short decay time and high detection efficiency, that make it superior to prior scintillators as a gamma ray or like radiation detector, in particular for homeland security applications, such as nuclear material detection.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION OF THE INVENTION

Before the present invention is described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

As used in the specification and the appended claims, the singular forms "a", "an", and "the" include plural references unless the context clearly dictates otherwise. Thus, for example, reference to a "crystal" includes a single crystal as well as a plurality of crystals.

The terms "optional" or "optionally" as used herein mean that the subsequently described feature or structure may or may not be present, or that the subsequently described event or circumstance may or may not occur, and that the description includes instances where a particular feature or structure is present and instances where the feature or structure is absent, or instances where the event or circumstance occurs and instances where it does not.

These and other objects, advantages, and features of the invention will become apparent to those persons skilled in the art upon reading the details of the invention as more fully described below.

The Inorganic Scintillators

The inorganic scintillator can be in a polycrystalline powder or a single crystal form. The crystal can be any size with an average volume of at least $0.001 \text{ mm}^3$, at least $1 \text{ mm}^3$, at least $5 \text{ mm}^3$, at least $10 \text{ mm}^3$, at least $100 \text{ mm}^3$, at least $3 \text{ cm}^3$, or at least $1 \text{ cm}^3$. The crystal can be any size with at least one dimension of the crystal having a length of at least 100 μm, at least 1 mm, at least 2 mm, at least 5 mm, at least 1 cm, at least 3 cm, at least 5 cm, or at least 10 cm. In some embodiments of the invention, the crystal has at least one dimension having a length that is of sufficient length, or depth, to stop or absorb gamma-radiation in order to electronically detect the gamma-radiation.

The lanthanide atoms in the inorganic scintillator substitute for the strontium and/or barium atoms.

The inorganic scintillators of the present invention are useful as they are scintillators and they produce a useful bright and fast scintillation in response to irradiation by short-wavelength high energy light, such as x-ray or gamma rays. The crystals of the inorganic scintillator also have the added advantage of having the property of readily growing into crystals. Large size crystals can be grown by the following technique: Bridgman growth and related techniques, Czochralski growth and related techniques, the traveling heater method and related techniques.

In some embodiments of the invention, $X^1$ and $X^2$ are each independently F, Cl, Br, or I. In some embodiments of the invention, Ln can be La, Ce, Pr, Nd, Pm, Sm, Eu, Gd, Tb, Dy, Ho, Er, Tm, Yb, or Lu. In some embodiments of the invention, M can be Li, Na, K, Rb, or Cs. Examples of lanthanides with a valence of 2+ are Eu and Yb. Examples of lanthanides with a valence of 3+ are Ce and Yb. The inorganic scintillator is a scintillator that produces a bright luminescence upon irradiation by a suitable radiation, such as gamma radiation.

In some embodiments of the invention, the lanthanide-doped strontium barium mixed halide has the formula (I), wherein $X^1$ is Cl, Br, or I, $X^2$ is Cl, Br, or I, Ln is a lanthanide with a valence of 2+ (such as $Eu^{2+}$), and x has a value having the range $0<x\leq2$ or $0<x<2$.

In some embodiments of the invention, the lanthanide-doped strontium barium mixed halide has the formula (II), wherein $X^1$ is Cl, Br, or I, $X^2$ is Cl, Br, or I, Ln is a lanthanide with a valence of 3+ (such as $Ce^{3+}$), M is an alkaline metal with an atomic number smaller than the atomic number of Sr and/or Ba (such as $Li^+$ or $Na^+$), and x has a value having the range $0<x\leq2$ or $0<x<2$.

In some embodiments of the invention, the lanthanide-doped strontium barium mixed halide has the formula (III), wherein $X^1$ is Cl, Br, or I, $X^2$ is Cl, Br, or I, Ln is a lanthanide with a valence of 3+ (such as $Ce^{3+}$), and x has a value having the range $0<x\leq2$ or $0<x<2$.

In some embodiments of the invention, the lanthanide-doped strontium barium mixed halide has the formula (I), (II), or (III), wherein $X^1$ is Br, and $X^2$ is I. In some embodiments of the invention, the lanthanide-doped strontium barium mixed halide has the formula (I), (II), or (III), wherein $X^1$ is Br, $X^2$ is I, and x has a value of the range $0.3\leq x\leq1.2$. In some embodiments of the invention, the lanthanide-doped strontium barium mixed halide has the formula (I), wherein $X^1$ is Br, $X^2$ is I, and x has a value of the range $0.3\leq x\leq1.2$.

In some embodiments of the invention, the lanthanide-doped strontium barium mixed halide has the formula (I), (II), or (III), wherein x has a value having the range $0.1 \leq x \leq 1.9$, or $0.9 \leq x \leq 1.1$. In some embodiments of the invention, x has a value of about 1.

In some embodiments of the invention, the lanthanide-doped strontium barium mixed halide has the formula (I), (II), or (II), wherein y' has a value having the range $0 \leq y' \leq 0.85$.

In some embodiments of the invention, the lanthanide-doped strontium barium mixed halide has the formula (I), wherein y has a value having the range $0.001 \leq y \leq 1$, $0.001 \leq y \leq 0.5$, $0.001 \leq y \leq 0.3$, $0.05 \leq y \leq 0.15$, or $0.05 \leq y \leq 0.1$.

In some embodiments of the invention, the lanthanide-doped strontium barium mixed halide has the formula (II), wherein y has a value having the range $0.001 \leq y \leq 0.5$, $0.001 \leq y \leq 0.2$, or $0.01 \leq y \leq 0.1$.

In some embodiments of the invention, the lanthanide-doped strontium barium mixed halide has the formula (III), wherein z has a value having the range $0.001 \leq z \leq 0.1$, $0.01 \leq z \leq 0.1$, $0.001 \leq z \leq 0.05$, or $0.001 \leq z \leq 0.01$.

In some embodiments of the invention, the lanthanide-doped strontium barium mixed halide has the formula (I), wherein $X^1$ is Br, $X^2$ is I, x has a value of the range $0.3 \leq x \leq 1.2$, y' has a value having the range $0 \leq y' \leq 0.85$, Ln is Eu, and y is about 0.05.

Characterization of the Inorganic Scintillators

The crystals of the invention can be characterized using a variety of methods. The crystals can be characterized regarding X-ray diffractometry, X-ray luminescence spectra, X-ray fluorescence for concentration of activators, and/or pulsed X-ray time response. X-ray diffractometry determines the composition of crystalline solids, such as crystalline phase identification. X-ray luminescence spectra determines the spectra components. Pulsed X-ray time response determines luminosity, decay times, and fractions. X-ray luminescence is used to determine the relative luminosity of a crystal. An X-ray excited emission spectra is obtained of a crystal by irradiating the crystal with an X-ray and collecting the emission light at 90° by a CCD detector.

In some embodiments of the invention, the luminosity of the inorganic scintillator is more than the luminosity of yttrium aluminium perovskite (YAP) and/or bismuth germanate (BGO). In further embodiments of the invention, the luminosity of the inorganic scintillators is more than double the luminosity of YAP and/or BGO.

The inorganic scintillator crystals which contain fluorine are not sensitive to moisture and can be handled and stored under ambient conditions. The inorganic scintillator crystals which do not contain fluorine are less sensitive to moisture than $SrI_2$:Eu.

In some embodiments of the invention, the single crystal inorganic scintillators have a luminescence output of more than 50,000 photons/MeV, even up to about 94,000 photons/MeV, and/or a decay described in Table 2-4.

Preparation of the Inorganic Scintillators

The inorganic scintillators of the invention can be prepared using a variety of methods. For example, the crystals useful for fabrication of luminescent screens can be prepared by a solid-state reaction aided, or optionally not aided, by a flux of halides as described herein. In some embodiments, the single crystals are prepared by providing a composition comprising essentially of a mixture of halide salts useful for producing the inorganic scintillator as described herein. The mixture is heated to a temperature above the melting point of the reactants or up to about 900° C. using a simple programmable furnace to produce a reactive molten mixture. The reaction is maintained at temperature for the mixture to fully react and produce the desired melt. The resultant molten product of reaction is then cooled slowly at about 0.1 to 5° C./minute.

In some embodiments of the invention, the method for growing crystals with the general composition $Sr_aBa_b Eu_{1-a-b}Br_{2-c}I_c$ ($0 < a \leq 1$; $0 \leq b < 1$; $0 < c$) comprises growing the crystals by the melt or the Bridgman technique. Samples can be obtained by the melt technique using a procedure similar to Hodorowicz et al. (S. A. Hodorowicz and H. A. Eick, Journal of Solid State Chemistry, 1983, 46, 313-320, incorporated herein by reference). High-purity reactants obtained from Sigma-Aldrich (St. Louis, Mo.) can be used without further purification. In some embodiments of the invention, the method comprises mixing stoichiometric amounts of $SrBr_2$, $SrI_2$, $BaBr_2$, $BaI_2$, $EuBr_2$ and/or $EuI_2$ to produce a mixture, sealing the mixture in an evacuated quartz tube, heating the mixture to a temperature above the melting point of the reactants, and cooling the mixture to an ambient temperature at a rate of about 0.1 to 5° C./minute. The mixing step can comprise dry grinding in an agate mortar and pestle in an Ar filled glove-box. The heating step can further comprise annealing the mixture for a suitable period of time, such as about 24 hours. The method can comprise using the vertical, melt-based Bridgman technique to grow single-crystals in a sealed quartz tube. The temperature gradient can be about 30° C./cm and the growth rate about 1 mm/h. The products are moisture-sensitive and can be handled in an Ar glovebox.

A particular method of preparing the inorganic scintillator of the invention is as follows: Bridgman growth and related techniques, Czochralski growth and related techniques, the traveling heater method and related techniques. These methods can be used to produce the inorganic scintillator as single crystals on a one-by-one basis. The crystals containing fluorine can be produced using the Bridgman growth technique. The Czochralski growth method may not be suitable for producing the crystals containing fluorine.

The Bridgman growth technique is a directional solidification process. The technique involves using an ampoule containing a melt which moves through an axial temperature gradient in a furnace. Single crystals can be grown using either seeded or unseeded ampoules. The Bridgman growth technique is taught in Robertson J. M., 1986, Crystal growth of ceramics: Bridgman-Stockbarger method in Bever: 1986 "Encyclopedia of Materials Science and Engineering" Pergamon, Oxford pp. 963-964, which is incorporated by reference.

The Czochralski growth technique comprises a process of obtaining single-crystals in which a single crystal material is pulled out of the melt in which a single-crystal seed is immersed and then slowly withdrawn; desired optical properties and doping level is accomplished by adding dopants to the melt. The Czochralski growth technique is taught in J. Czochralski, "Ein neues Verfahren zur Messung der Kristallisationsgeschwindigkeit der Metalle" [A new method for the measurement of the crystallization rate of metals], Z. Phys. Chemie 92 (1918) 219-221, which is incorporated by reference. The method is well-know to those skilled in the art in producing a wide variety of compounds, including semiconductors and scintillator materials (such as $LaBr_3$:Ce).

The traveling heater method is described in Triboulet, Prog. Cryst. Gr. Char. Mater., 128, 85 (1994) and Funaki et al., Nucl. Instr. And Methods, A 436 (1999), which are incorporated in their entireties by reference.

A particular method of preparing inorganic scintillators of the invention is the ceramic method which comprises the following steps: The reactant mixture is placed in a container, such as a glove box, filled with one or more inert gas, such as nitrogen gas. The container is under a very dry condition. The dry condition is required due to the hygroscopic nature of the halides within the reactant mixture. The two or more powder reactants are ground together, such as with a mortar and pestle, for a sufficient period, such as about 10 minutes, to produce a reactant mixture. When Ln halide is added to the powder reactants for grinding, methanol can be further added, and grinding can take place until the mixture appears dry. The reactant mixture is sintered under high temperature and pressure.

In some embodiment of the invention, the single crystals of the inorganic sciontillator can be grown by melting and re-solidifying the pre-synthesized compounds in powder form, such as described herein, or directly from melting the mixtures of the halides salts and lanthanide halides used as activators. To grow best performing crystals the starting compounds might need to be purified further by zone refining.

Growing the single crystal involves loading the mixtures, such as described herein, in a quartz ampoule in a dry environment and sealing the ampoule using a high temperature torch, maintaining the dry environment at a reduced pressure, in the ampoule. The ampoule is then placed in a furnace. The growth of the crystal can be performed by a variation of the known vertical "Bridgman" technique. The compound is melted, let to homogenized at a temperature above the melting point and the compound is solidified in a directional manner in a temperature gradient. The ampoule is shaped to provide a nucleation site at the bottom (conical shape). The solidification front moves upward. Horizontal configurations and other growth techniques such as Czochralski (may need to pressurized the growth chamber) could be used.

The resulting crystals are then characterized by the methods described herein. The resulting crystals also have properties similar to those described herein.

Application of the Inorganic Scintillators

The present invention provides for a gamma ray or x-ray detector, comprising: a scintillator composed of a transparent single crystal of the inorganic scintillator of the present invention, and a photodetector optically coupled to the scintillator for producing an electrical signal in response to the emission of a light pulse by the scintillator.

The inorganic scintillators of this invention have many advantages over other known crystals. The inorganic scintillators produce a luminescence in response irradiation, such as irradiation by alpha-, beta-, or gamma-radiation, that is brighter and faster than known and commercially used scintillators. The scintillating crystals have a number of applications as detectors, such as in the detection of gamma-ray, which has use in national security, such as for detection of nuclear materials, and medical imaging applications.

The invention is useful for the detection of ionizing radiation. Applications include medical imaging, nuclear physics, nondestructive evaluation, treaty verification and safeguards, environmental monitoring, and geological exploration. This will be a major improvement, providing much finer resolution, higher maximum event rates, and clearer images.

Also, Ce activated inorganic scintillator crystals of the present invention can be useful in positron emission tomography (PET).

The invention also relates to the use of the scintillating material above as a component of a detector for detecting radiation in particular by gamma rays and/or X-rays. Such a detector especially comprises a photodetector optically coupled to the scintillator in order to produce an electrical signal in response to the emission of a light pulse produced by the scintillator. The photodetector of the detector may in particular be a photomultiplier, photodiode, or CCD sensor.

A particular use of this type of detector relates to the measurement of gamma or x-ray radiation, such a system is also capable of detecting alpha and beta radiation and electrons. The invention also relates to the use of the above detector in nuclear medicine apparatuses, especially gamma cameras of the Anger type and positron emission tomography scanners (see, for example C. W. E. Van Eijk, "Inorganic Scintillator for Medical Imaging", International Seminar New types of Detectors, 15 19 May 1995—Archamp, France. Published in "Physica Medica", Vol. XII, supplement 1, June 96; hereby incorporated by reference).

In another particular use, the invention relates to the use of the above detector in detection apparatuses for oil drilling, (see, for example "Applications of scintillation counting and analysis", in "Photomultiplier tube, principle and application", chapter 7, Philips; hereby incorporated by reference).

One embodiment of the invention is shown in FIG. 7 which shows a gamma ray detector. The detector can be one as described in U.S. Pat. No. 4,958,080, hereby incorporated by reference. It will be understood, of course, that the utility of the novel single crystal inorganic scintillator of the invention is not limited to the detection of gamma radiation but that it has general application to the detection of other types of like radiation, e.g. X-rays, cosmic rays, and energetic particles.

Figure 6:
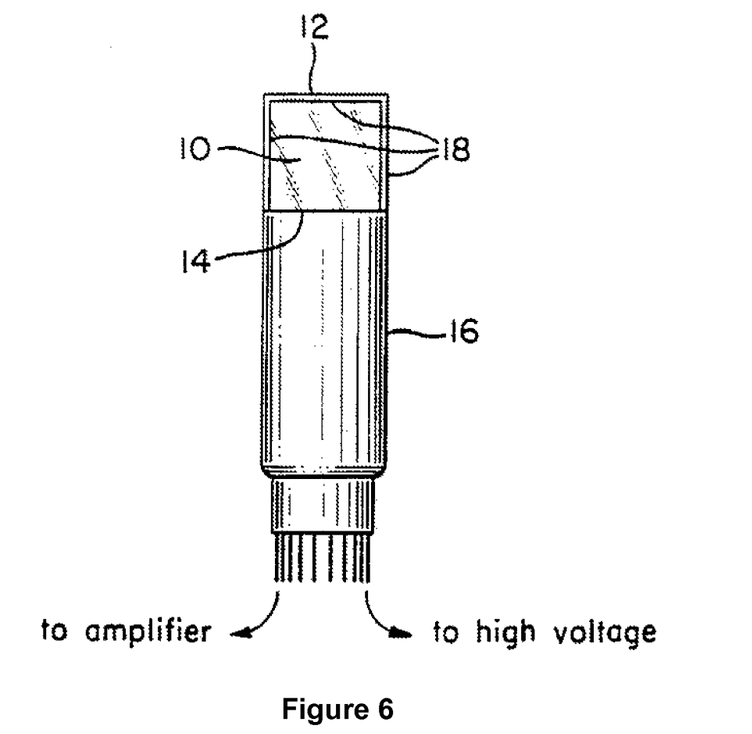
FIG. 6 is a diagrammatic view of one embodiment of a scintillation detector in accordance with the present invention.

In FIG. 6, a single crystal inorganic scintillator 10 is shown encased within the housing 12 of a gamma ray detector. One face 14 of the scintillator is placed in optical contact with the photosensitive surface of a photomultiplier tube 16. Alternatively, the light pulses could be coupled to the photomultiplier via light guides or fibers, lenses, mirrors, or the like. The photomultiplier can be replaced by any suitable photodetector such as a photodiode, microchannel plate, etc. In order to direct as much of each light flash to the photomultiplier as possible, the other faces 18 of the inorganic scintillator are preferably surrounded or covered with a reflective material, e.g. Teflon tape, magnesium oxide powder, aluminum foil, or titanium dioxide paint. Light pulses emitted by the crystal inorganic scintillator upon the incidence of radiation are intercepted, either directly or upon reflection from the surfaces 18, by the photomultiplier, which generates electrical pulses or signals in response to the light pulses. These electrical output pulses are typically first amplified and then subsequently processed as desired, e.g. in a pulse height amplifier, to obtain the parameters of interest regarding the detected radiation. The photomultiplier is also connected to a high voltage power supply, as indicated in FIG. 7. Other than the inorganic scintillator, all of the components and materials referred to in connection with FIG. 7 are conventional, and thus need not be described in detail.

It is to be understood that, while the invention has been described in conjunction with the preferred specific embodiments thereof, the foregoing description is intended to illustrate and not limit the scope of the invention. Other aspects, advantages, and modifications within the scope of the invention will be apparent to those skilled in the art to which the invention pertains.

All patents, patent applications, and publications mentioned herein are hereby incorporated by reference in their entireties.

The invention having been described, the following examples are offered to illustrate the subject invention by way of illustration, not by way of limitation.

EXAMPLE 1

Experimental

Crystals with the general composition $Sr_aBa_bEu_{1-a-b}Br_{2-c}I_c$ ($0<a\leq1$; $0\leq b<1$; $0<c$) are grown either by the melt or the Bridgman technique. Samples are obtained by the melt technique using a procedure similar to Hodorowicz et al. (S. A. Hodorowicz and H. A. Eick, Journal of Solid State Chemistry, 1983, 46, 313-320, incorporated herein by reference). High-purity reactants are obtained from Sigma-Aldrich and used without further purification. Stoichiometric amounts of $SrBr_2$, $SrI_2$, $BaBr_2$, $BaI_2$, $EuBr_2$ and $EuI_2$ are thoroughly mixed by dry grinding in an agate mortar and pestle in an Ar filled glove-box. The powder is sealed in an evacuated quartz tube and heated above the melting point of the reactants and annealed for 24 hours. This is followed by cooling to ambient temperature at a rate of 0.1° C./min. The vertical, melt-based Bridgman technique to grow single-crystals in sealed quartz tubes is used. The temperature gradient is about 30° C./cm and the growth rate 1 mm/h. Samples with varying amount of Eu dopant are synthesized. The products are moisture-sensitive and handled in the Ar glovebox.

Characterization:

The purity of the samples is confirmed using powder X-ray diffraction (XRD) with a Bruker Nonius FR591 rotating anode X-ray generator equipped with a copper target and a 50 kV and 60 mA electron beam. X-ray excited emission spectra are measured at the second port of the Bruker Nonius X-ray generator and their spectral response is recorded by a SpectraPro-2150i spectrometer (Acton Research Corp., Acton, Mass.) coupled to a PIXIS:100B charge-coupled detector (Princeton Instruments, Inc., Trenton, N.J.). Photoluminescence (PL) excitation and emission spectra are measured at room temperature utilizing a Horiba Fluorolog 3 fluorescence spectrometer within the spectral range of 250 nm-800 nm. The X-ray excited decay curves are measured on a custom made pulsed X-ray system consisting of an ultrafast laser (200 fs pulses at 165 kHz), a light-excited X-ray tube, a Hamamatsu R3809U-50 microchannel PMT, and an Ortec 9308 picosecond time analyzer. The impulse response of the system is 100 ps FWHM. Pulse height spectra are recorded under gamma-ray excitation ($^{137}Cs$) with a Hamamatsu R6231-100 photomultiplier tube (PMT) connected to an Ortec 113 preamplifier, an Ortec 672 spectroscopic amplifier and an Ortec EASY-MCA-8K multichannel analyzer. The PMT high voltage was fixed at 650 V. Samples are optically coupled onto the window of the PMT with Viscasil 600000 (GE) and covered with layers of ultraviolet light reflecting tape (PTFE).

Figure 1:
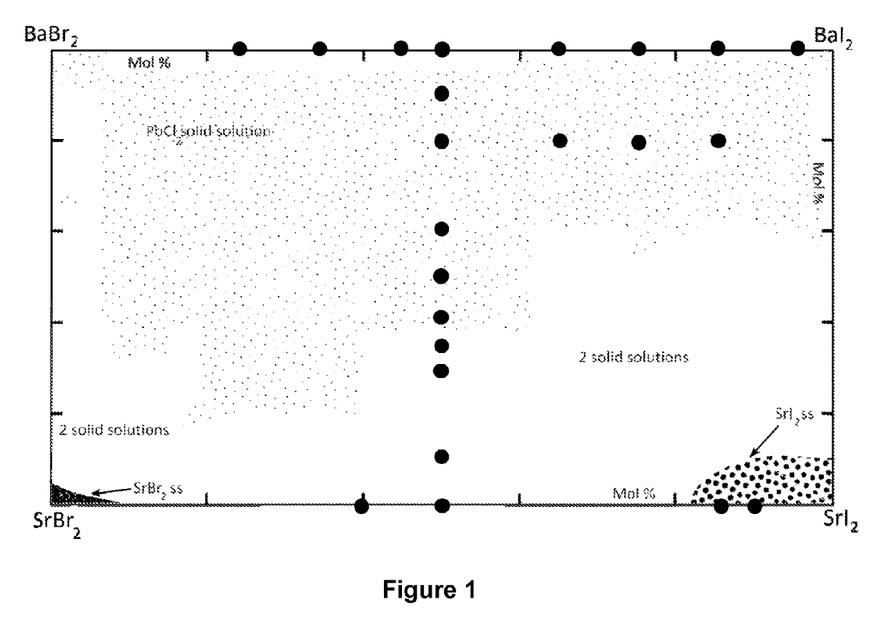
FIG. 1 shows a phase diagram showing the different crystal structures in the $SrI_2$—$SrBr_2$—$BaI_2$—$BaBr_2$ compositions. Black dots are samples with 5% Eu dopant, the properties of which are reported in Tables 1-4.
Figure 2:
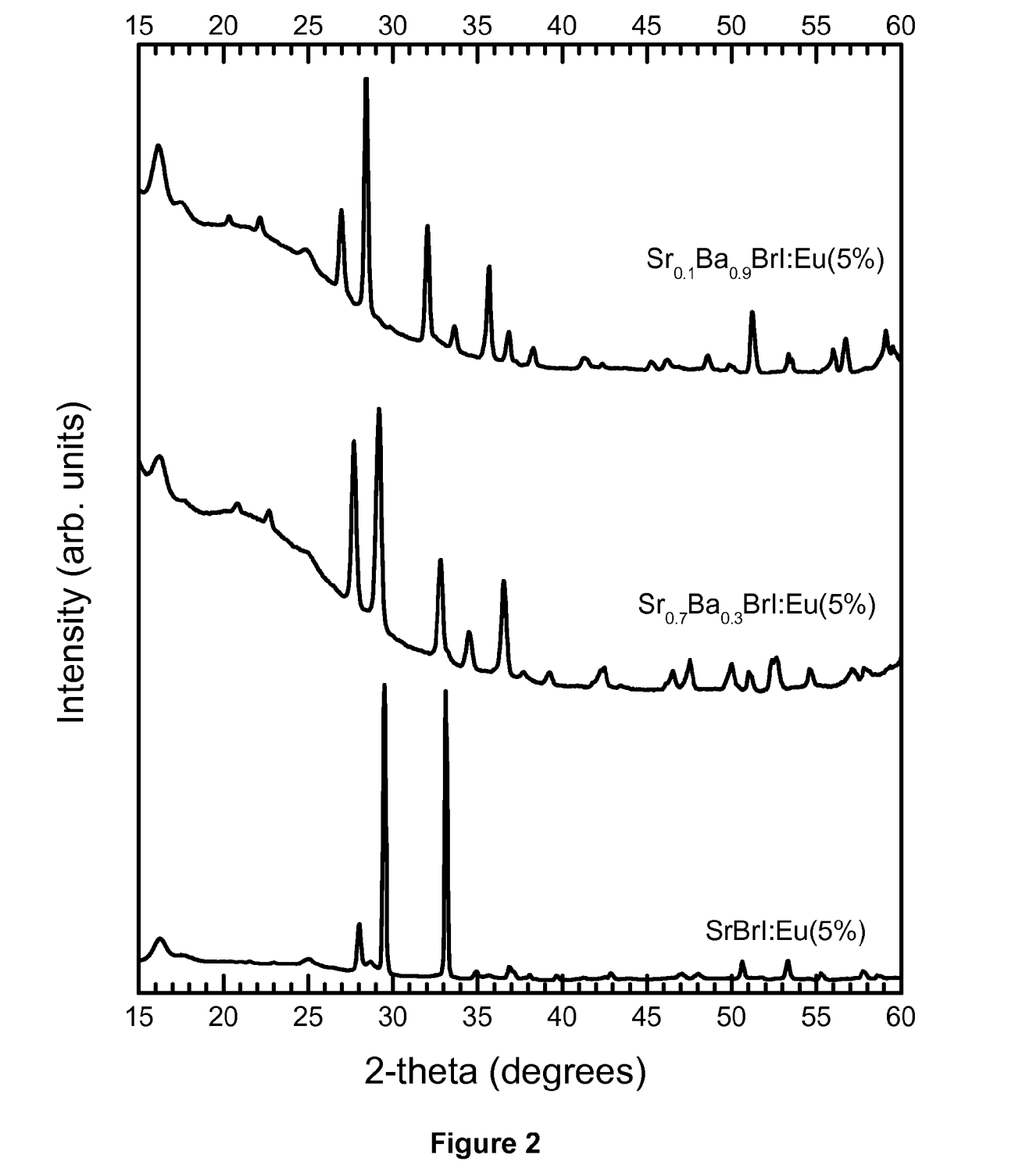
FIG. 2 shows a powder X-ray diffraction pattern for 3 samples with varying Sr/Ba ratios.

Description of Figures:

The phase diagram for $SrI_2$—$SrBr_2$—$BaI_2$—$BaBr_2$ has been reported in 1968 (Frit, Moakil-Chbany and Hagenmuller, C. R. Seances Acad. Sci. Ser. C. 1968, 267, 1046) and is shown in FIG. 1. Black dots represent samples containing 5% Eu dopant that are shown in Tables 1-4. The phase diagram depicts mainly 3 structure types—the $SrBr_2$, the $SrI_2$ and the $PbCl_2$ structures. In FIG. 2, the X-ray diffraction pattern for 3 samples that show the $PbCl_2$ structure are shown. The patterns are very similar to each other with a slight increase in the lattice parameter due to replacement of smaller Sr atoms by larger Ba atoms in the lattice. No impurities corresponding to the dopant Eu or other reactants are observed.

Figure 3:
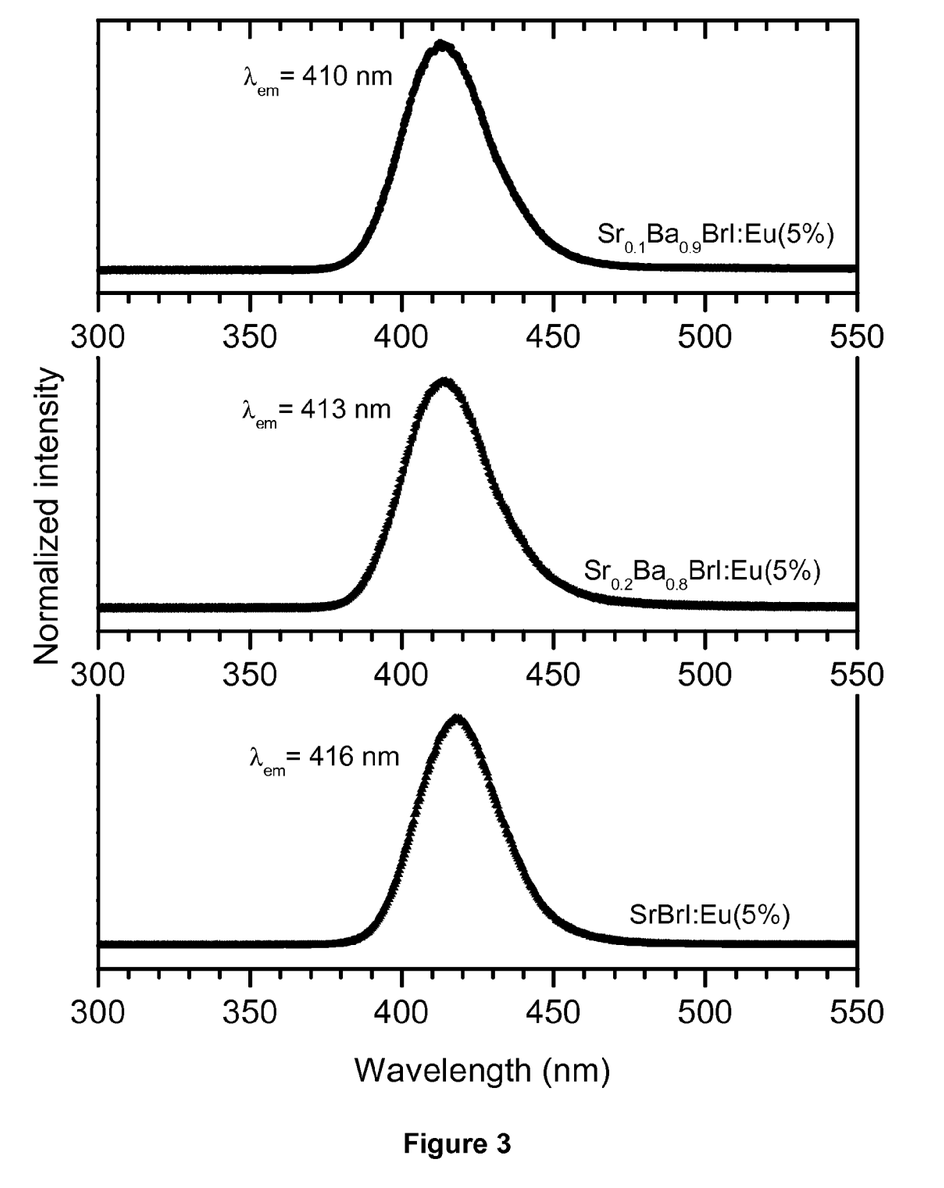
FIG. 3 shows the room temperature X-ray luminescence spectra for 3 samples with varying Sr/Ba ratios.

The emission spectra for the samples on excitation with X-rays are shown in FIG. 3. The emission spectrum for each sample consists of a single emission centered between 410 and 420 nm. The emission is characteristic of the 5d-4f transition of $Eu^{2+}$. Based on the crystal structure and composition, the emission peak position varies between 400 and 450 nm, as seen in Tables 1-4.

Figure 4:
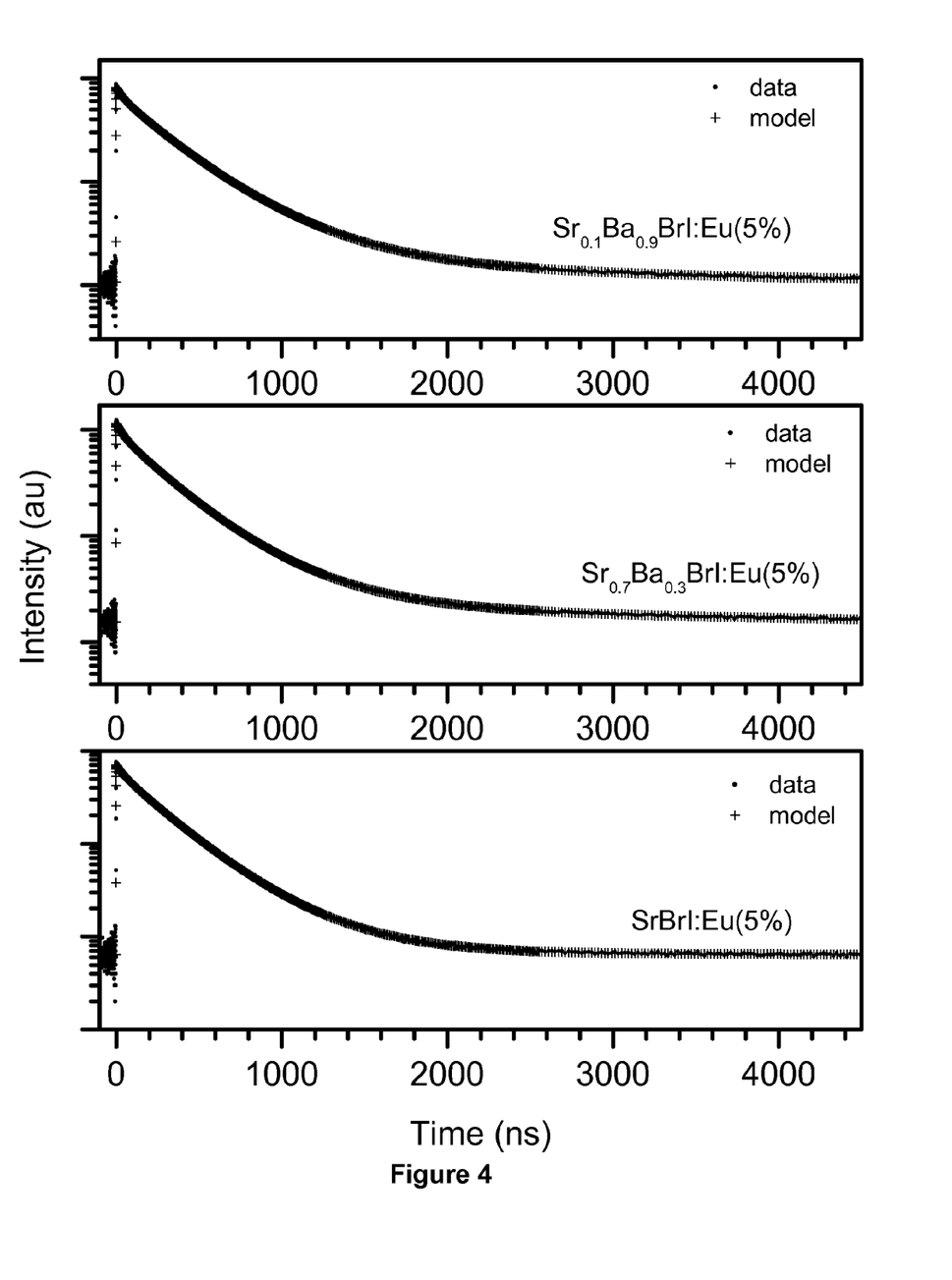
FIG. 4 shows the room temperature pulsed X-ray decay curves for 3 samples with varying Sr/Ba ratios.

In FIG. 4, the X-ray excited decay curves for SrBrI:Eu as well as other samples with varying Sr/Ba ratios are shown. The decay curve for SrBrI:Eu reveals that ~85% of the light decays within 1000 nanoseconds. The decay characteristics vary slightly with composition and crystal structures and are listed in the Tables 1-4.

Figure 5:
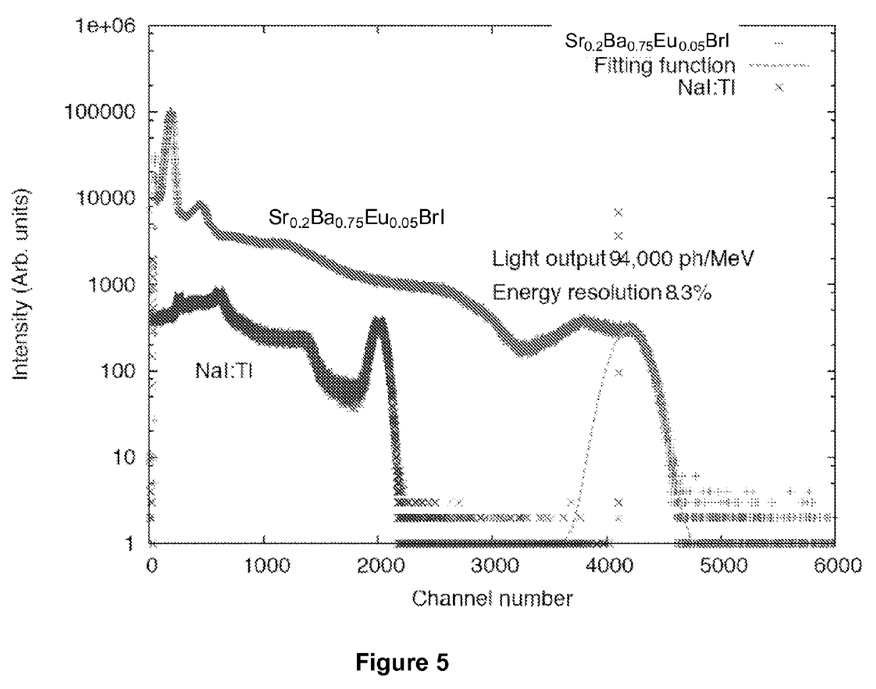
FIG. 5 shows the pulsed height spectra of $Sr_{0.2}Ba_{0.75}Eu_{0.05}BrI$ and NaI:Tl single crystals measured under $^{137}Cs$ (662 keV) gamma ray excitation.

FIG. 5 shows the pulsed height spectrum for a $Sr_{0.2}Ba_{0.75}Eu_{0.05}BrI$ single crystal grown by Bridgman and NaI:Tl (Saint Gobain) under $^{137}Cs$ irradiation (662 keV). The light output is estimated by comparison with the response of NaI:Tl (luminosity 43,000-45,000 ph/MeV. The light output for $Sr_{0.2}Ba_{0.75}Eu_{0.05}BrI$ is estimated to be 94,000±9,000 ph/MeV. The energy resolution is defined as the FWHM of the 662 keV full absorption peak. A value of 8.3% is measured.

TABLE 1

$BaBr_2$—$BaI_2$

| Composition | $\lambda_{em}$ (nm) | Decay components | | | Constant |
| --- | --- | --- | --- | --- | --- |
| | | $1^{st}$ | $2^{nd}$ | $3^{rd}$ | |
| $Ba_{0.95}Eu_{0.05}Br_{1.5}I_{0.5}$ | 410 | 207 ns-11% | 390 ns-67% | 1330 ns-4% | 17% |
| $Ba_{0.95}Eu_{0.05}Br_{1.3}I_{0.7}$ | 410 | 210 ns-12% | 388 ns-67% | 1923 ns-4% | 15% |
| $Ba_{0.95}Eu_{0.05}Br_{1.1}I_{0.9}$ | 411 | 158 ns-4% | 346 ns-67% | 677 ns-9% | 0% |
| $Ba_{0.95}Eu_{0.05}BrI$ | 409 | 133 ns-7% | 313 ns-59% | 741 ns-15% | 0% |
| $Ba_{0.95}Eu_{0.05}Br_{0.7}I_{1.3}$ | 415 | | 352 ns-66% | 1148 ns-15% | 19% |
| $Ba_{0.95}Eu_{0.05}Br_{0.5}I_{1.5}$ | 424 | | 333 ns-65% | 974 ns-19% | 16% |
| $Ba_{0.95}Eu_{0.05}Br_{0.3}I_{1.7}$ | 422 | 210 ns-23% | 373 ns-59% | 1434 ns-9% | 8% |
| $Ba_{0.95}Eu_{0.05}Br_{0.1}I_{1.9}$ | 420 | 174 ns-28% | 411 ns-67% | | 5% |

TABLE 2

BaBrI—SrBrI

| Composition | $\lambda_{em}$ (nm) | Decay components | | | Constant |
| --- | --- | --- | --- | --- | --- |
| | | $1^{st}$ | $2^{nd}$ | $3^{rd}$ | |
| $Ba_{0.95}Eu_{0.05}BrI$ | 409 | 133 ns-7% | 313 ns-59% | 741 ns-15% | 0% |
| $Ba_{0.85}Sr_{0.1}Eu_{0.05}BrI$ | 410 | 226 ns-23% | 415 ns-48% | 2273 ns-8% | 19% |
| $Ba_{0.75}Sr_{0.2}Eu_{0.05}BrI$ | 413 | 241 ns-35% | 471 ns-27% | | 18% |
| $Ba_{0.55}Sr_{0.4}Eu_{0.05}BrI$ | 415 | 178 ns-26% | 376 ns-57% | 5046 ns-6% | 11% |

TABLE 2-continued

BaBrI—SrBrI

| Composition | $\lambda_{em}$ (nm) | Decay components | | | Constant |
|---|---|---|---|---|---|
| | | $1^{st}$ | $2^{nd}$ | $3^{rd}$ | |
| $Ba_{0.45}Sr_{0.5}Eu_{0.05}BrI$ | 416 | 242 ns-31% | 388 ns-41% | 887 ns-4% | 16% |
| $Ba_{0.35}Sr_{0.60}Eu_{0.05}BrI$ | 413 | 202 ns-11% | 318 ns-63% | 864-10% | 14% |
| $Ba_{0.3}Sr_{0.65}Eu_{0.05}BrI$ | 414 | 233 ns-29% | 397 ns-40% | 1147 ns-4% | 11% |
| $Ba_{0.25}Sr_{0.7}Eu_{0.05}BrI$ | 418 | 178 ns-68% | 309 ns-12% | | 1% |
| $Ba_{0.10}Sr_{0.85}Eu_{0.05}BrI$ | 416 | | 302 ns-52% | 1094 ns-4% | 27% |
| $Sr_{0.95}Eu_{0.05}BrI$ | 416 | 156 ns-6% | 273 ns-56% | 487 ns-19% | 17% |

TABLE 3

$SrBr_2$—$SrI_2$

| Composition | $\lambda_{em}$ (nm) | Decay components | | | Constant |
|---|---|---|---|---|---|
| | | $1^{st}$ | $2^{nd}$ | $3^{rd}$ | |
| $Sr_{0.95}Eu_{0.05}Br_{1.2}I_{0.8}$ | 417 | | 254 ns-39% | 456 ns-26% | 34% |
| $Sr_{0.95}Eu_{0.05}BrI$ | 416 | 156 ns-6% | 273 ns-56% | 487 ns-19% | 17% |
| $Sr_{0.95}Eu_{0.05}Br_{0.3}I_{1.7}$ | 430 | | 237 ns-35% | 593 ns-54% | 9% |
| $Sr_{0.95}Eu_{0.05}Br_{0.2}I_{1.8}$ | 435 | | 241 ns-16% | 984 ns-68% | 15% |

TABLE 4

$(Sr,Ba)(Br,I)_2$

| Composition | $\lambda_{em}$ (nm) | Decay components | | | Constant |
|---|---|---|---|---|---|
| | | $1^{st}$ | $2^{nd}$ | $3^{rd}$ | |
| $Ba_{0.75}Sr_{0.2}Eu_{0.05}Br_{0.7}I_{1.3}$ | 423 | 311 ns-47% | 611 ns-42% | 4761 ns-15% | 5% |
| $Ba_{0.75}Sr_{0.2}Eu_{0.05}Br_{0.5}I_{1.5}$ | 425 | 305 ns-43% | 611 ns-44% | 4435 ns-14% | 6% |
| $Ba_{0.75}Sr_{0.2}Eu_{0.05}Br_{0.3}I_{1.7}$ | 421 | 373 ns-58% | 951 ns-22% | | 0% |
| $Ba_{0.55}Sr_{0.4}Eu_{0.05}Br_{0.3}I_{1.7}$ | 427 | 267 ns-5% | 419 ns-32% | 1067 ns-11% | 53% |
| $Ba_{0.5}Sr_{0.45}Eu_{0.05}Br_{0.6}I_{1.4}$ | 416 | 306 ns-82% | | 1077 ns-7% | 8% |

These inorganic scintillator crystals are useful for national security purposes, such as detecting nuclear material.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. An inorganic scintillator having the formula:

$$Sr_{1-y'-y}Ba_{y'}X^1_x X^2_{2-x}:Ln_y \qquad (I)$$

wherein $X^1$ is a first halogen element, $X^2$ is a second halogen element, $X^1$ and $X^2$ are not the same halogen element and are each independently Cl, Br, or I, Ln is a lanthanide with a valence of 2+, x has a value having the range $0<x\leq2$, y' has a value having the range $0\leq y'<1$, y has a value having the range $0<y\leq1$, and $y'+y<1$; and the inorganic scintillator is a single crystal having at least one dimension of a length of at least 1 mm, or a length at least sufficient to stop or absorb gamma-radiation.

2. The inorganic scintillator of claim 1, wherein $X^1$ is Br and $X^2$ is I.

3. The inorganic scintillator of claim 1, wherein Ln is Eu or Yb.

4. The inorganic scintillator of claim 1, wherein x has a value having the range $0\leq x\leq2$.

5. The inorganic scintillator of claim 4, wherein x has a value having the range $0.3\leq x\leq1.2$.

6. The inorganic scintillator of claim 1, wherein y' has a value having the range $0\leq y'\leq0.85$.

7. The inorganic scintillator of claim 1, wherein y has a value having the range $0.001\leq y\leq0.5$.

8. The inorganic scintillator of claim 2, wherein Ln is Eu, x has a value having the range $0.3\leq x\leq1.2$, y' has a value having the range $0\leq y'\leq0.85$, and y is about 0.05.

9. The inorganic scintillator of claim 1, wherein the single crystal has at least one dimension of a length of at least 5 mm.

10. An inorganic scintillator having the formula:

$$Sr_{1-y'-2y}Ba_{y'}X^1_x X^2_{2-x}:Ln_y,M_y \qquad (II)$$

wherein $X^1$ is a first halogen element, $X^2$ is a second halogen element, $X^1$ and $X^2$ are not the same halogen element, Ln is a lanthanide with a valence of 3+, M is an alkaline metal with an atomic number smaller than the atomic number of Sr or Ba, x has a value having the range $0<x<2$, and y' has a value having the range $0\leq y'\leq1$, y has a value having the range $0<y\leq0.5$, and $y'+2y<1$; or, $$Sr_{1-y'-z}Ba_{y'}X^1_x X^2_{2-x}:Ln_z \qquad (III)$$

wherein $X^1$ is a first halogen element, $X^2$ is a second halogen element, $X^1$ and $X^2$ are not the same halogen element and are each independently Cl, Br, or I, Ln is a lanthanide with a valence of 3+, x has a value having the range $0<x<2$, y' has a value having the range $0\leq y'<1$, and z has a value having the range $0<z\leq 0.1$, and $y'+z<1$; and wherein the inorganic scintillator is a single crystal having at least one dimension of a length of at least 1 mm, or a length at least sufficient to stop or absorb gamma-radiation.

11. The inorganic scintillator of claim 10, wherein $X^1$ is Br and $X^2$ is I.

12. The inorganic scintillator of claim 10, wherein Ln is Ce.

13. The inorganic scintillator of claim 10, wherein the inorganic scintillator has the formula (II) and M is Li or Na.

14. The inorganic scintillator of claim 10, wherein x has a value having the range $0.3\leq x\leq 1.2$.

15. The inorganic scintillator of claim 10, wherein y' has a value having the range $0\leq y'\leq 0.85$.

16. The inorganic scintillator of claim 10, wherein the inorganic scintillator has the formula (II) and y has a value having the range $0.001\leq y\leq 0.5$.

17. The inorganic scintillator of claim 10, wherein the inorganic scintillator has the formula (III) and z has a value having the range $0.001\leq z\leq 0.1$.

18. The inorganic scintillator of claim 10, wherein the single crystal has at least one dimension of a length of at least 5 mm.

19. The inorganic scintillator of claim 10, wherein the inorganic scintillator has the formula:

$$Sr_{1-y'-2y}Ba_{y'}X^1_xX^2_{2-x}:Ln_y,M_y \quad (II);$$

wherein $X^1$ is a first halogen element, $X^2$ is a second halogen element, $X^1$ and $X^2$ are not the same halogen element, Ln is a lanthanide with a valence of 3+, M is an alkaline metal with an atomic number smaller than the atomic number of Sr or Ba, x has a value having the range $0<x<2$, and y' has a value having the range $0\leq y'<1$, y has a value having the range $0<y\leq 0.5$, and $y'+2y<1$.

20. The inorganic scintillator of claim 10, wherein the inorganic scintillator has the formula:

$$Sr_{1-y'-z}Ba_{y'}X^1_xX^2_{2-x}:Ln_z \quad (III);$$

wherein $X^1$ is a first halogen element, $X^2$ is a second halogen element, $X^1$ and $X^2$ are not the same halogen element and are each independently Cl, Br, or I, Ln is a lanthanide with a valence of 3+, x has a value having the range $0<x<2$, y' has a value having the range $0\leq y'<1$, and z has a value having the range $0<z\leq 0.1$, and $y'+z<1$.

21. An inorganic scintillator having the formula:

$$Sr_{1-y'-y}Ba_{y'}X^1_xX^2_{2-x}:Ln_y \quad (I);$$

wherein $X^1$ is a first halogen element, $X^2$ is a second halogen element, $X^1$ and $X^2$ are not the same halogen element, Ln is a lanthanide with a valence of 2+, x has a value having the range $0<x\leq 2$, y' has a value having the range $0\leq y'<1$, y has a value having the range $0<y\leq 1$, and $y'+y<1$;

$$Sr_{1-y'-2y}Ba_{y'}X^1_xX^2_{2-x}:Ln_y,M_y \quad (II);$$

wherein $X^1$ is a first halogen element, $X^2$ is a second halogen element, $X^1$ and $X^2$ are not the same halogen element, Ln is a lanthanide with a valence of 3+, M is an alkaline metal with an atomic number smaller than the atomic number of Sr or Ba, x has a value having the range $0<x<2$, and y' has a value having the range $0\leq y'<1$, y has a value having the range $0<y\leq 0.5$, and $y'+2y<1$; or, $$Sr_{1-y'-z}Ba_{y'}X^1_xX^2_{2-x}:Ln_z \quad (III);$$

wherein $X^1$ is a first halogen element, $X^2$ is a second halogen element, $X^1$ and $X^2$ are not the same halogen element, Ln is a lanthanide with a valence of 3+, x has a value having the range $0<x<2$, y' has a value having the range $0<y'<1$, and z has a value having the range $0<z\leq 1$, and $y'+z<1$; and wherein the inorganic scintillator is a single crystal having at least one dimension of a length of at least 1 mm, or a length at least sufficient to stop or absorb gamma-radiation.

22. The inorganic scintillator of claim 21, wherein the inorganic scintillator has the formula:

$$Sr_{1-y'-y}Ba_{y'}X^1_xX^2_{2-x}:Ln_y \quad (I);$$

wherein $X^1$ is a first halogen element, $X^2$ is a second halogen element, $X^1$ and $X^2$ are not the same halogen element, Ln is a lanthanide with a valence of 2+, x has a value having the range $0<x\leq 2$, y' has a value having the range $0<y'<1$, y has a value having the range $0<y\leq 1$, and $y'+y<1$.

23. The inorganic scintillator of claim 21, wherein the inorganic scintillator has the formula:

$$Sr_{1-y'-2y}Ba_{y'}X^1_xX^2_{2-x}:Ln_y,M_y \quad (II);$$

wherein $X^1$ is a first halogen element, $X^2$ is a second halogen element, $X^1$ and $X^2$ are not the same halogen element, Ln is a lanthanide with a valence of 3+, M is an alkaline metal with an atomic number smaller than the atomic number of Sr or Ba, x has a value having the range $0<x<2$, and y' has a value having the range $0\leq y'<1$, y has a value having the range $0<y\leq 0.5$, and $y'+2y<1$.

24. The inorganic scintillator of claim 23, wherein y' has a value having the range $0<y'<1$.

25. The inorganic scintillator of claim 21, wherein the inorganic scintillator has the formula:

$$Sr_{1-y'-z}Ba_{y'}X^1_xX^2_{2-x}:Ln_z \quad (III);$$

wherein $X^1$ is a first halogen element, $X^2$ is a second halogen element, $X^1$ and $X^2$ are not the same halogen element, Ln is a lanthanide with a valence of 3+, x has a value having the range $0<x<2$, y' has a value having the range $0<y'<1$, and z has a value having the range $0<z\leq 0.1$, and $y'+z<1$.

26. A device for detecting an ionizing radiation comprising:

(a) an inorganic scintillator having the formula:

$$Sr_{1-y'-y}Ba_{y'}X^1_xX^2_{2-x}:Ln_y \quad (I);$$

wherein $X^1$ is a first halogen element, $X^2$ is a second halogen element, $X^1$ and $X^2$ are not same halogen element, Ln is a lanthanide with a valence of 2+, x has a value having the range $0<x\leq 2$, y' has a value having the range $0\leq y'<1$, y has a value having the range $0<y\leq 1$, and $y'+y<1$;

$$Sr_{1-y'-2y}Ba_{y'}X^1_xX^2_{2-x}:Ln_y,M_y \quad (II);$$

wherein $X^1$ is a first halogen element, $X^2$ is a second halogen element, $X^1$ and $X^2$ are not same halogen element, Ln is a lanthanide with a valence of 3+, M is an alkaline metal with an atomic number smaller than the atomic number of Sr or Ba, x has a value having the range 0<x<2, and y' has a value having the range 0≦y'<1, y has a value having the range 0<y≦0.5, and y'+2y<1; or, $$Sr_{1-y'-z}Ba_{y'}X^1_xX^2_{2-x}:Ln_z \quad (III);$$

wherein $X^1$ is a first halogen element, $X^2$ is a second halogen element, $X^1$ and $X^2$ are not the same halogen element, Ln is a lanthanide with a valence of 3+, x has a value having the range 0<x<2, y' has a value having the range 0≦y'<1, and z has a value having the range 0<z≦0.1, and y'+z<1; and, wherein the inorganic scintillator is a single crystal having at least one dimension of a length of at least 1 mm, or a length at least sufficient to stop or absorb gamma-radiation; and, (b) a photodetector optically coupled to the scintillator for producing an electrical signal in response to an emission of a light pulse by the scintillator.

27. The device according to claim 25, wherein the photodetector is a photomultiplier, photodiode, or CCD sensor.

* * * * *